(12) United States Patent
Grasshoff (10) Patent No.: US 8,791,017 B2
(45) Date of Patent: Jul. 29, 2014

(54) METHODS OF FORMING CONDUCTIVE STRUCTURES USING A SPACER EROSION TECHNIQUE

(75) Inventor: Gunter Grasshoff, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 217 days.

(21) Appl. No.: 13/281,552

(22) Filed: Oct. 26, 2011

(65) Prior Publication Data

US 2013/0109174 A1    May 2, 2013

(51) Int. Cl.
*H01L 21/768*  (2006.01)
*H01L 21/302*  (2006.01)

(52) U.S. Cl.
USPC ............ 438/675; 257/E21.585; 257/E21.214; 257/E21.569; 438/702; 438/3; 438/634; 438/739

(58) Field of Classification Search
USPC ................... 257/E21.585, E21.214, E21.569; 438/675, 702, 3, 634, 739
See application file for complete search history.

(56) References Cited

U.S. PATENT DOCUMENTS

| | | | |
|---|---|---|---|
| 5,656,544 A | 8/1997 | Bergendahl et al. | |
| 5,677,563 A | 10/1997 | Cronin et al. | |
| 5,780,338 A * | 7/1998 | Jeng et al. | 438/253 |
| 6,794,293 B2 * | 9/2004 | Li et al. | 438/700 |
| 6,821,907 B2 * | 11/2004 | Hwang et al. | 438/709 |
| 7,153,779 B2 * | 12/2006 | Trapp | 438/706 |
| 7,235,478 B2 * | 6/2007 | Geng et al. | 438/634 |
| 7,628,866 B2 * | 12/2009 | Lin et al. | 134/2 |
| 7,745,231 B2 * | 6/2010 | Liu et al. | 438/3 |

* cited by examiner

*Primary Examiner* — Lex Malsawma
*Assistant Examiner* — Sheng Zhu
(74) *Attorney, Agent, or Firm* — Amerson Law Firm, PLLC (57) ABSTRACT

Disclosed herein are various methods of forming conductive structures, such as conductive lines and via, on an integrated circuit device using a spacer erosion technique. In one example, the method includes forming a patterned hard mask layer above a layer of insulating material, the patterned hard mask having a hard mask opening, forming an erodible spacer in the hard mask opening to thereby define a spacer opening and performing at least one etching process through the spacer opening on the layer of insulating material to define a trench therein for a conductive structure, wherein the erodible spacer is substantially eroded away during the at least one etching process.

15 Claims, 8 Drawing Sheets

METHODS OF FORMING CONDUCTIVE STRUCTURES USING A SPACER EROSION TECHNIQUE

BACKGROUND OF THE INVENTION

1. Field of the Invention

Generally, the present disclosure relates to the manufacturing of sophisticated semiconductor devices, and, more specifically, to various methods of forming conductive structures, such as conductive lines and via, on an integrated circuit device using a spacer erosion technique.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NFET and PFET transistors) represent one important type of circuit elements that substantially determine performance of the integrated circuits. Other types of semiconductor devices include resistors, capacitors, diodes, etc. These basic semiconductor devices are arranged and configured in various electrical circuits that perform a desired function on the integrated circuit device. These integrated circuits are formed by connecting the various semiconductor devices to one another using a complex wiring system. Typically, the wiring systems are comprised on multiple metallization layers, each of which contains conductive lines and conductive vias. The conductive vias usually are the means by which the metal lines in adjacent metallization layers are conductively coupled to one another.

Improving the functionality and performance capability of various metallization systems has become important in designing modern semiconductor devices. One example of such improvements is the enhanced use of copper metallization systems in integrated circuit devices and the use of so-called "low-k" dielectric materials (materials having a dielectric constant less than 3) in such devices. Copper metallization systems exhibit improved electrical conductivity as compared to, for example, prior art metallization systems using tungsten for the conductive lines and vias. The use of low-k dielectric materials also tends to improve the signal-to-noise ratio (S/N ratio) by reducing crosstalk as compared to other dielectric materials with higher dielectric constants. However, the use of such low-k dielectric material can be problematic as they tend to be less resistant to metal migration as compared to some other dielectric materials.

Figure 1A:
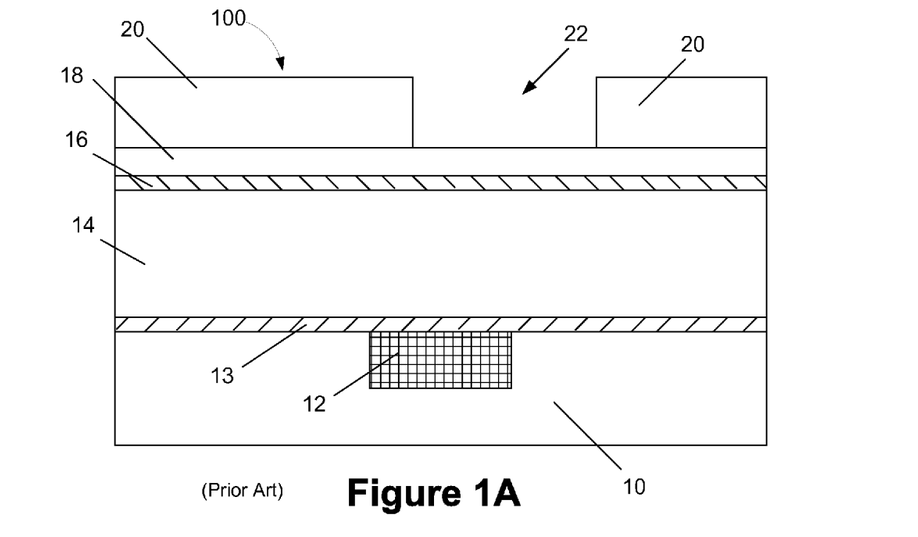
FIG. 1A-1G depict one illustrative prior art technique employed to form conductive lines and via on an integrated circuit device.

FIGS. 1A-1G depict one illustrative prior art process flow for forming conductive structures, i.e., metal lines and via, on an integrated circuit device. FIG. 1A depicts an illustrative prior art device 100 at an early stage of manufacture. The device 100 is formed above a semiconducting substrate (not shown). As shown therein, an illustrative conductive metal line 12 is formed in a layer of insulating material 10 that is formed above the substrate. The insulating layer 10 and the metal line 12 may be part of a metallization layer for an integrated circuit device that may include several metallization layers. An illustrative etch stop layer 13, an insulating layer 14 an etch stop layer 16 a metal hard mask layer 18 and a patterned mask layer 20 having an opening 22 formed therein.

The various layers depicted in FIG. 1A may be comprised of a variety of different materials and they may be formed by performing a variety of known processing operations, like chemical vapor deposition (CVD), physical vapor deposition (PVD), atomic layer deposition (ALD), or plasma-enhanced versions of such deposition processes, and traditional photolithography processes. In one illustrative embodiment, the insulating layers 10, 14 may be comprised of a so-called low-k insulating material (k value less than 2.7), the etch stop layer 13 may be comprised of a material known in the trade as BLOK, or any other material that will serve to protect the underlying metal line 12 when forming a via opening in the insulating layer 14. The etch stop layer 16 may also be comprised of a variety of materials such as silicon dioxide. The metal hard mask layer 18 may be comprised of a variety of metals such as, for example, titanium nitride. The patterned mask layer 20 may be comprised of one or more layers of material. In one embodiment, the patterned mask layer 20 may be a multi-layer system comprised of an organic planarization layer (OPL) formed on the metal hard mask layer 18, an anti-reflective coating (ARC) formed on the OPL and a layer of photoresist formed above the ARC layer. The opening 22 in the mask layer 20 may be formed by performing traditional photolithography and etching techniques. In the depicted embodiment, the opening 22 corresponds to the width of a metal line that will be formed in the insulating layer 14. The metal line 12 may be made of a variety of materials such as, for example, copper.

Figure 1B:
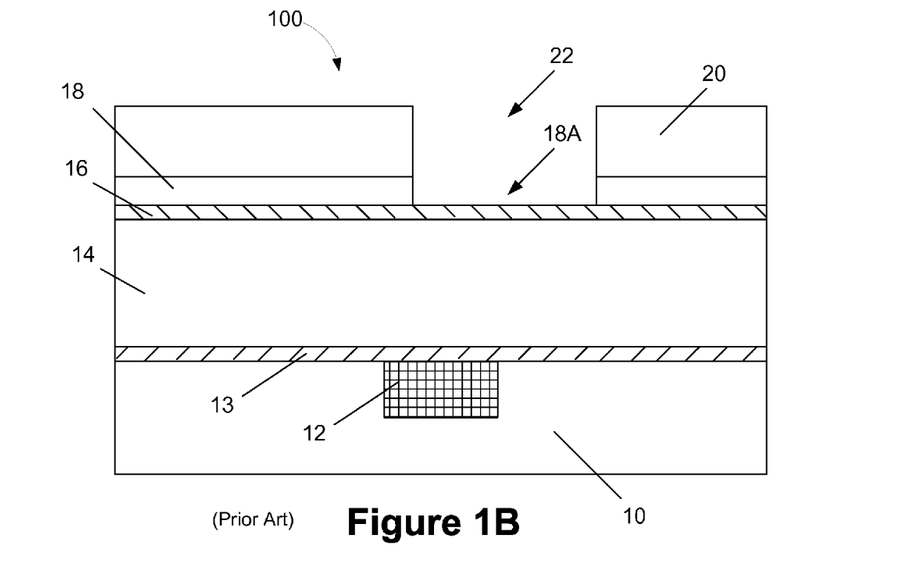

As shown in FIG. 1B, an etching process, wet or dry, is performed on the metal hard mask layer 18 to define an opening 18A therein. This etching process stops on the etch stop layer 16.

Figure 1C:
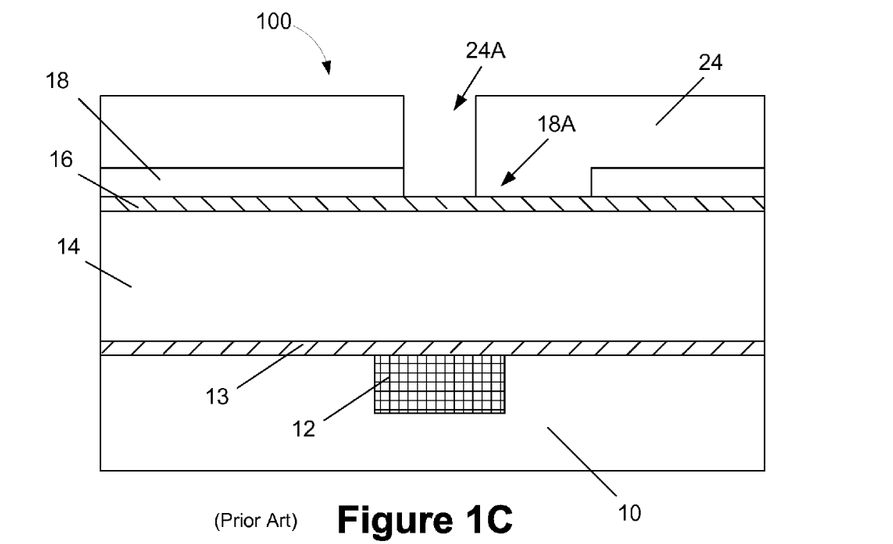

Next, as shown in FIG. 1C, the mask layer 20 is removed and a via mask layer 24 is formed on the device 100. The via mask layer 24 has an opening 24A that will be used in etching a via opening in the insulating layer 14. The via mask layer 24 may be comprised of one or more material layers. In one illustrative embodiment, the via mask layer 24 is a layer of photoresist material that is formed by performing known photolithography techniques.

Figure 1D:
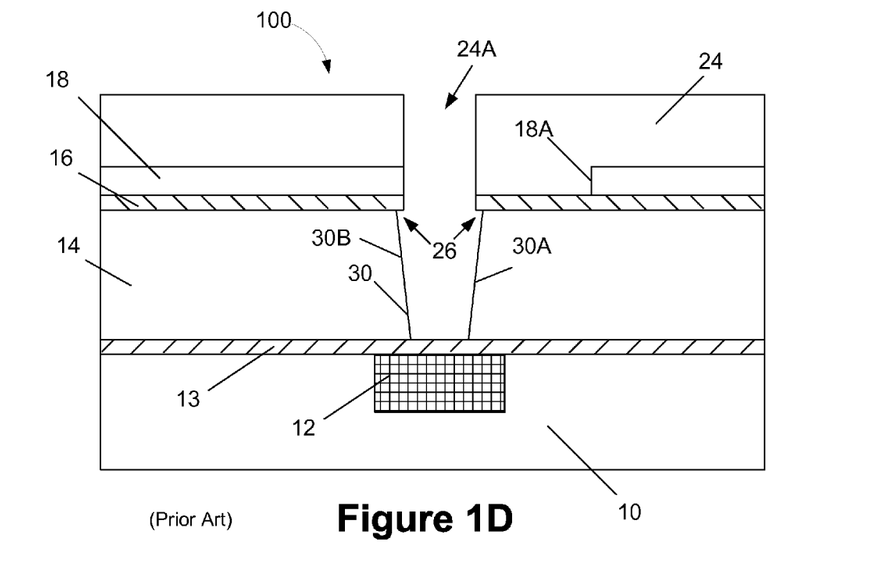

Then, as shown in FIG. 1D, one or more etching process, wet or dry, is performed through the mask layer on the etch stop layer 16 and the layer of insulating material 14 to define a via opening 30 therein. Given the presence of different materials, the etch chemistry employed may need to be changed to etch through the layer 16, 14. In the depicted example this etching process stops on the etch stop layer 13. In some cases, the etching process may be controlled such that the via opening 30 does not extend all the way down to the etch stop layer 13 at this stage of the process.

Figure 1E:
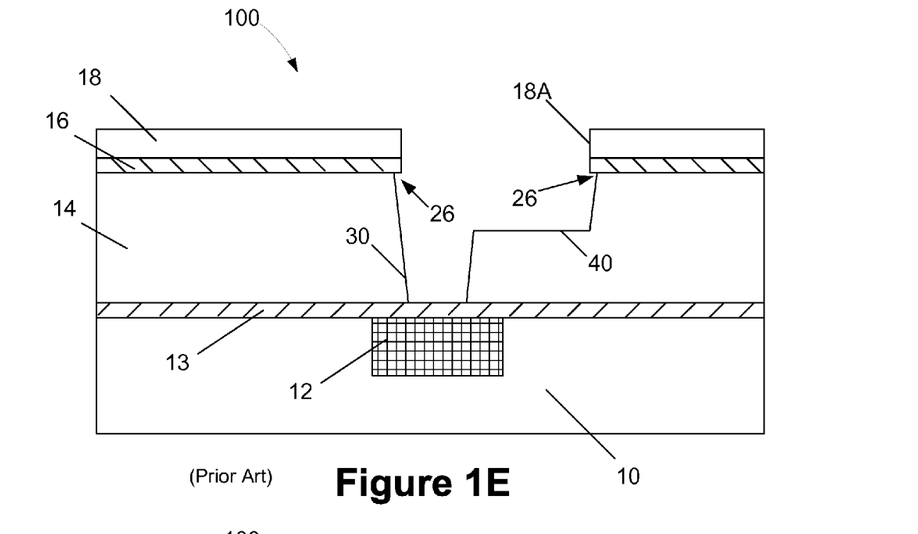
Figure 1F:
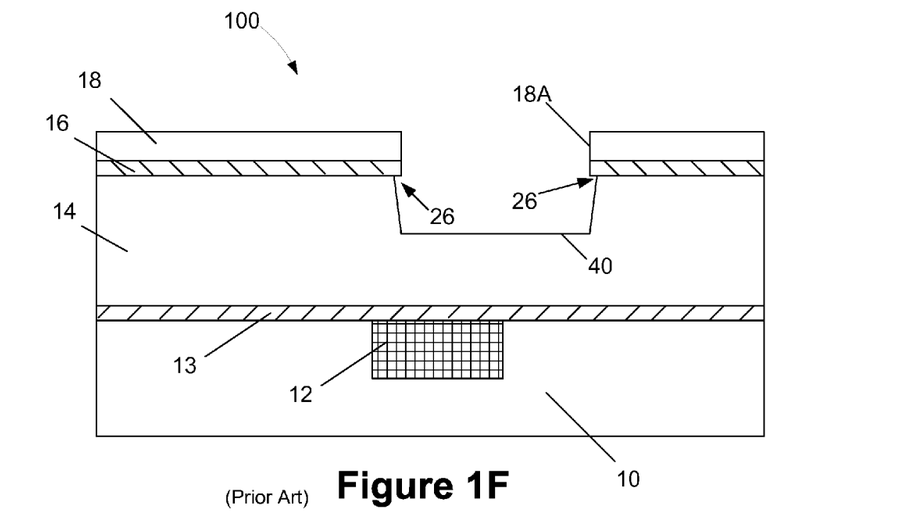

Next, as shown in FIG. 1E, the via mask layer 24 is removed and one or more etching process are performed through the metal hard mask layer 18 to define a trench 40 in the layer of insulating material 14. The trench 40 may extend into and out of the drawing plane as the metal line that will be formed therein may be routed in any desired direction across the device 100. In the cross-sectional view depicted in FIG. 1E, the trench contacts via opening 30 so that the conductive via that will be formed in the via opening 30 will be conductively contact the metal line that will be formed in the trench 40. FIG. 1F is a cross-sectional view of the device 100 in a plane that is different from the plane depicted in FIG. 1E. FIG. 1F depicts only the trench 40 as it is formed in the layer of insulating material 14.

Figure 1G:
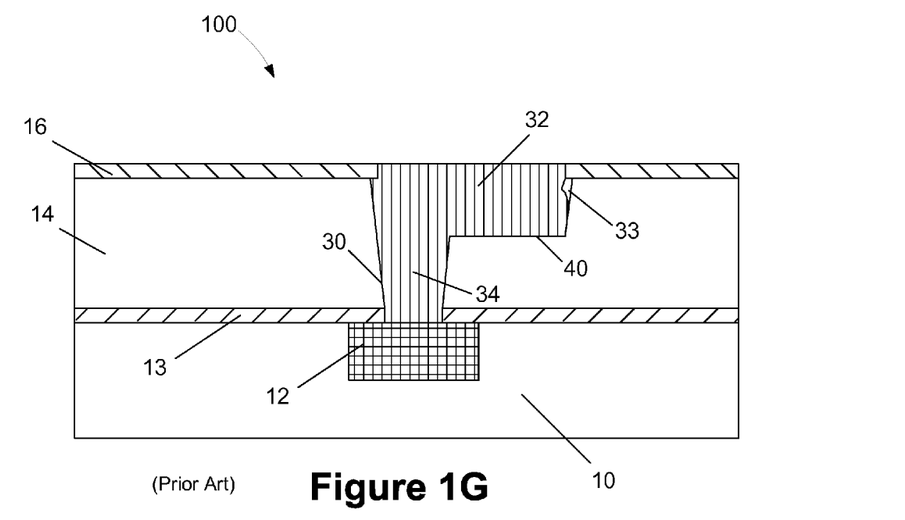

FIG. 1G depicts the device 100 after several process operations have been performed. More specifically, in FIG. 1G, an etching process is performed on the etch stop layer 13 to expose the underlying metal line 12. Thereafter, a conductive via 34 and a conductive line 32 are formed in the via opening 30 and the trench 40, respectively. The conductive via 34 and line 32 may be formed by depositing one or more barrier layers (not shown) and thereafter depositing an appropriate conductive material, such as copper across the device 100. Thereafter, a chemical mechanical polishing (CMP) process may be performed using the stop layer 16 as a polish stop to remove the conductive materials positioned outside of the trench 40 and the via opening 30. This CMP process removes the metal hard mask 18.

One problem encountered with using the prior art process described above, at least when using low-k insulating material for the layer 14, is that it may lead to the formation of undesirable voids 33 in the metal line 32, one of which is schematically depicted in FIG. 1G. With reference to FIG. 1F, during the process of forming the trench 40, the etching process tends to undercut or erode the low-k insulating material 14 in the areas identified by the reference number 26. Such undercutting is particularly noticed when reactive ion etching (RIE) process are performed in defining the trench 40. The presence of such undercut regions 26 tend to increase possibility of voids 33 in the final conductive structure, e.g., the metal line 32.

The present disclosure is directed to various methods of forming conductive structures, such as conductive lines and via, on an integrated circuit device using a spacer erosion technique that may at least reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming conductive structures, such as conductive lines and via, on an integrated circuit device using a spacer erosion technique. In one example, the method includes forming a patterned hard mask layer above a layer of insulating material, the patterned hard mask having a hard mask opening, forming an erodible spacer in the hard mask opening to thereby define a spacer opening and performing at least one etching process through the spacer opening on the layer of insulating material to define a trench therein for a conductive structure, wherein the erodible spacer is substantially eroded away during the at least one etching process.

Another illustrative method disclosed herein includes forming a patterned hard mask layer above a layer of insulating material, wherein the patterned hard mask has a hard mask opening with a critical dimension that corresponds to a final critical dimension for a conductive structure to be formed in the layer of insulating material, forming an erodible spacer in the hard mask opening to thereby define a spacer opening that has a critical dimension that is less that the critical dimension of the hard mask opening and performing at least one etching process through the spacer opening on the layer of insulating material to define a trench therein where the conductive structure is to be formed, wherein the erodible spacer is eroded away during the etching process so as to increase the critical dimension of the spacer opening as the etching process is performed.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming conductive structures, such as conductive lines and via, on an integrated circuit device using a spacer erosion technique. As will be readily apparent to those skilled in the art upon a complete reading of the present application, the present method is applicable to a variety of devices, including, but not limited to, logic devices, memory devices, etc. With reference to FIGS. 2A-2H, various illustrative embodiments of the methods and devices disclosed herein will now be described in more detail. To the extent that the same reference numbers are used in both FIGS. 1A-1G and FIGS. 2A-2H, the previous description of those structures applies equally to FIGS. 2A-2H.

Figure 2A:
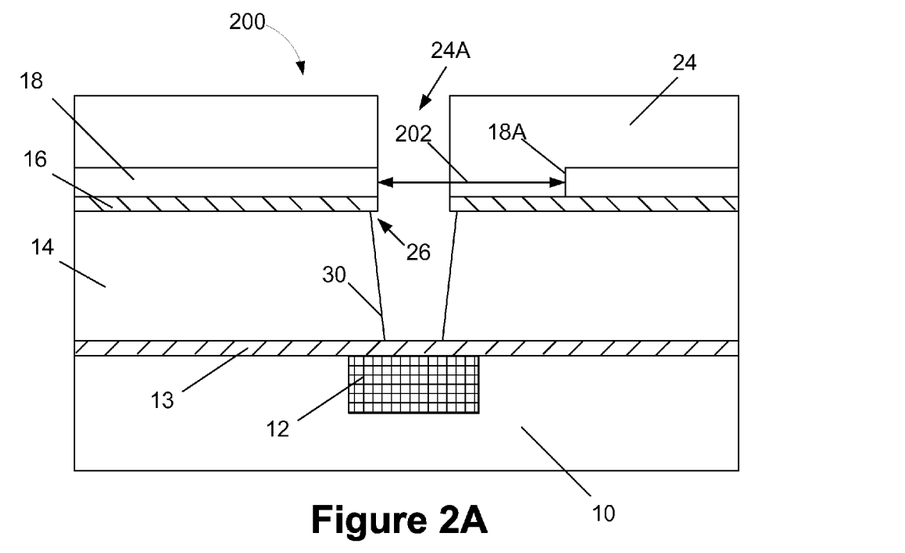
FIGS. 2A-2H depict various novel methods disclosed herein for of forming conductive structures, such as conductive lines and via, on an integrated circuit device.

FIG. 2A is a simplified view of an illustrative semiconductor device 200 at an early stage of manufacturing. More specifically, FIG. 2A depicts the device 200 at a similar stage of fabrication as depicted in FIG. 1B for the semiconductor device 100. The semi-conductor device 200 is formed above semiconducting substrate (not shown). The substrate may have a variety of configurations, such as a bulk silicon configuration or a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate may also be made of materials other than silicon.

As shown in FIG. 2A, an illustrative conductive metal line 12 is formed in a layer of insulating material 10 that is formed above the substrate. The insulating layer 10 and the metal line 12 may be part of a metallization layer for an integrated circuit device that may include several metallization layers. An illustrative etch stop layer 13, an insulating layer 14 an etch stop layer 16 a metal hard mask layer 18 and a patterned mask layer 20 having an opening 22 formed therein.

The various layers depicted in FIG. 2A may be comprised of a variety of different materials and they may be formed by performing a variety of known processing operations, like chemical vapor deposition (CVD), physical vapor deposition (PVD), atomic layer deposition (ALD), or plasma-enhanced versions of such deposition processes, and traditional photolithography processes. In one illustrative embodiment, the insulating layers 10, 14 may be comprised of a so-called low-k insulating material (k value less than 3), the etch stop layer 13 may be comprised of carbon-rich material or a material known in the trade as BLOK, or any other material that will serve to protect the underlying metal line 12 when forming a via opening in the insulating layer 14. The etch stop layer 16 may also be comprised of a variety of materials such as silicon oxynitride, silicon dioxide (bases on silane, or TEOS, for example), and it may have a thickness of about 20-50 nm for current day technologies. The metal hard mask layer 18 may be comprised of a variety of metals such as, for example, titanium nitride having a thickness of about 15-50 nm for current day technologies. As shown in FIG. 2A, an etching process, wet or dry, has been performed on the metal hard mask layer 18 to define a hard mask opening 18A therein. In one illustrative embodiment, the hard mask opening 18A corresponds to the final desired critical dimension 202 for the upper portion of a conductive metal line to be formed in the insulating layer 14. The patterned metal hard mask layer 18 may be formed by performing one on more etching process through a patterned mask layer (not shown) formed above the metal hard mask layer 18. This etching process stops on the etch stop layer 16. The patterned mask layer used in etching the metal hard mask layer 18 may be comprised of one or more layers of material. In one embodiment, the patterned mask layer used to etch the metal hard mask layer may be a multi-layer system comprised of an organic planarization layer (OPL) formed on the metal hard mask layer 18, an anti-reflective coating (ARC) formed on the OPL and a layer of photoresist formed above the ARC layer. Also depicted in FIG. 2A is a via mask layer 24 that is formed on the device 200. The via mask layer 24 has an opening 24A that will be used in etching a via opening in the insulating layer 14. The via mask layer 24 may be comprised of one or more material layers. In one illustrative embodiment, the via mask layer 24 is a layer of photoresist material that is formed by performing known photolithography techniques.

Figure 2B:
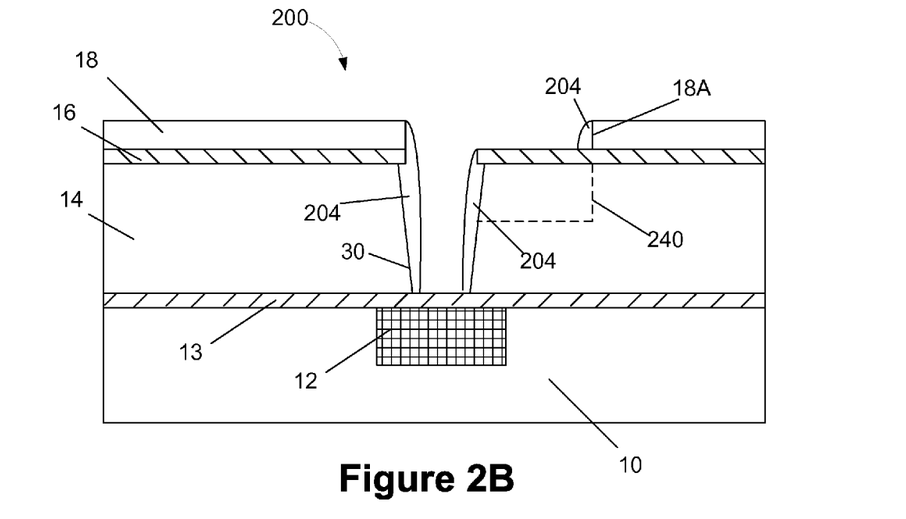

Next as shown in FIG. 2B, erodible spacers 204 are formed on the device 200. In one illustrative example, the erodible spacers 204 may be comprised of a $C_xH_yF_z$ polymer material (hereinafter a "CF polymer" material), etc., that is generated in an in situ process step. The erodible spacers 204 may have an initial base thickness of several nanometers, e.g., about 2-5 nm, although the thickness may vary depending upon the particular application. In one illustrative embodiment, the spacers 204 may be formed in the same process chamber that is used to etch the trench 240. Alternatively, the spacers 204 may be formed by depositing a layer of spacer material above the hard mask layer 18 and in the hard mask opening 18A using a conformal deposition process such as a conformal process and thereafter performing an anisotropic etching process to define the spacers 204 in the opening 18A and in the via opening 30.

Figure 2C:
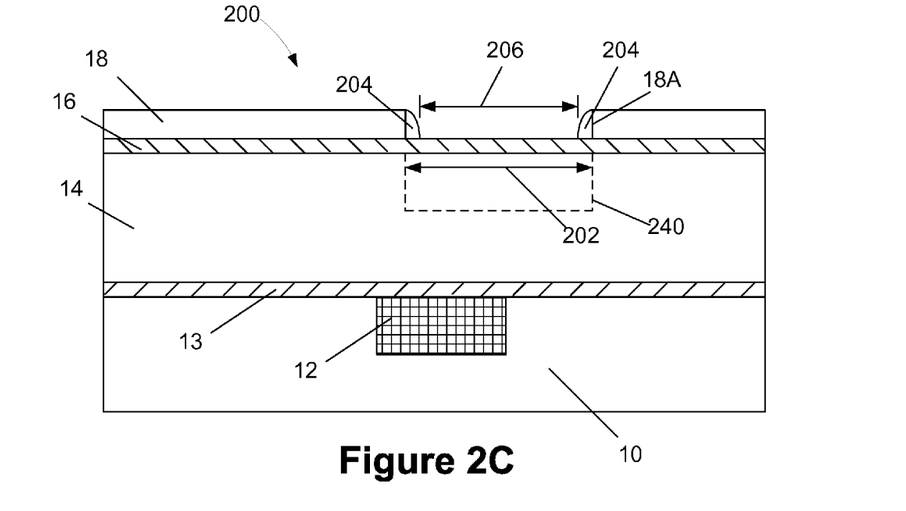

In the cross-sectional view depicted in FIG. 2B, the trench 240 (shown in dashed lines) will be formed in the layer of insulating material such that it contacts via opening 30 so that the conductive via that will be formed in the via opening 30 will conductively contact the metal line that will be formed in the trench 240. FIG. 2C is a cross-sectional view of the device 200 in a plane that is different from the plane depicted in FIG. 2B. FIG. 2C depicts only the trench 240 (again in dashed lines) as it will be formed in the layer of insulating material 14. As shown therein, the spacers 204 define a spacer opening having a critical dimension 206 that is less than the critical dimension 202 (defined by the hard mask opening 18A in the hard mask layer 18) for the metal line (not shown in FIG. 2C) that will be formed in the layer of insulating material 14.

Figure 2D:
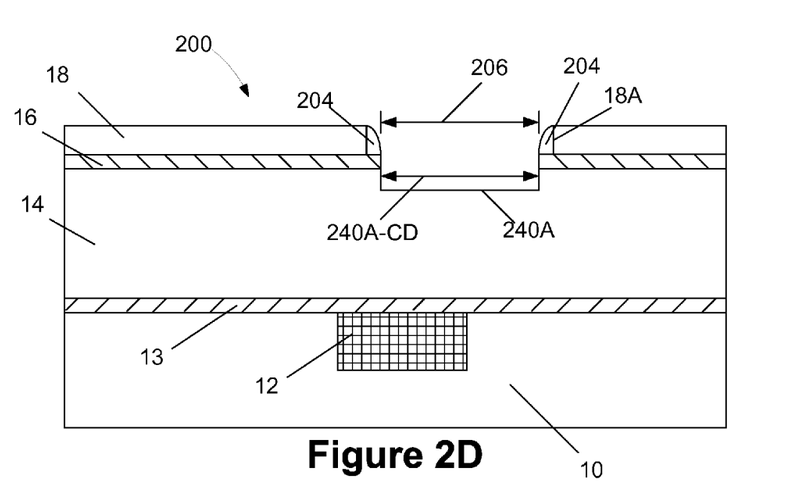
Figure 2E:
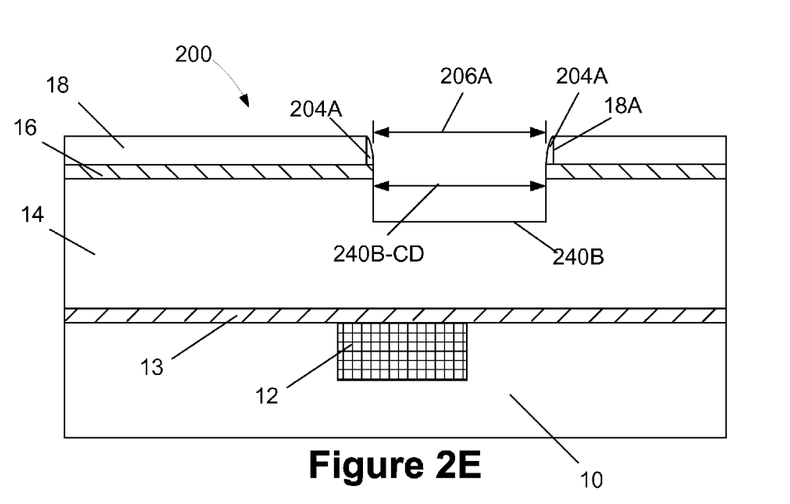
Figure 2F:
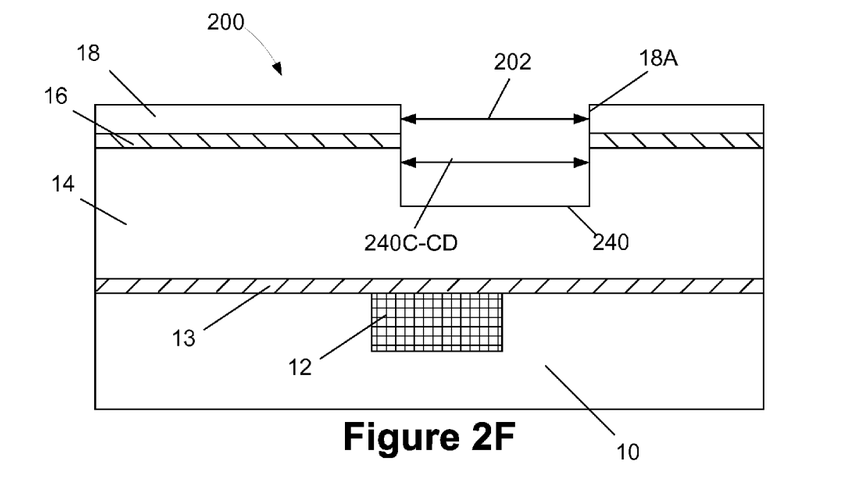

In general, the spacers 204 are comprised of a material that may be eroded away (or at least significantly removed) during the etching process or processes that are performed to define the trench 240 in the layer of insulating material 14. In one illustrative embodiment, the etching process performed to form the trench 240 is a RIE etching process wherein appropriate changes are made to the etch chemistry, where necessary, to etch through layers of material. To that end, FIG. 2D-2F depict an illustrative process flow where the spacers 204 are eroded away during the etching process or processes that are performed to define the trench 240. FIG. 2D depicts the device 200 at a point during the etching process wherein the etch front has passed through the etch stop layer 16 and the trench 240 is formed to an initial depth 240A. At this stage of the etching process, the spacers 204 have suffered little if any erosion and the critical dimension 240A-CD at the top of the initial trench 240A is approximately the same as the critical dimension 206 defined by the originally formed spacers 204. However, as will be recognized by those skilled in the art after a complete reading of the present application, the depiction of the trench herein is idealized in nature. That is, in a real-world device, the sidewalls of the trench will typically be inwardly-tapered to some degree. However, such tapering is not shown in the figures. FIG. 2E depicts the device 200 at a later point during the etching process wherein the etch front has extended the depth of the trench to a depth 240B that is greater that the initial depth 240A. At this stage of the etching process, the original spacers 204 have eroded to a sufficient degree such that the eroded spacers 204A now define a critical dimension 206A that is greater than the critical dimension 206 defined by the original, non-eroded spacers 204. The critical dimension 240B-CD at the top of this deeper trench 240B is approximately the same as the critical dimension 206A defined by the spacers 204A. FIG. 2F depicts the device 200 at an even later point during the etching process wherein the etch front has extended the depth of the trench 240 to its final depth 240C, wherein the final depth 240C is greater than either the initial depth 240A or the intermediate depth 240B. At this stage of the etching process, in this illustrative example, the original spacers 204 have been completely eroded away such the critical dimension 240C-CD at the top of the final trench 240 is approximately the same as the critical dimension 202 defined by the hard mask opening 18A in the hard mask layer 18. In short, using the methods disclosed herein the critical dimension of the spacer opening defined by the spacers 204 increases as the etching process performed to form the trench 240 proceeds. Note that, using this novel process wherein the critical dimension of the spacer opening and the trench at the top of the trench increases as the etching process proceeds deeper into the insulation layer 14 tends to reduce or eliminate the undercutting 26 (see, e.g., FIG. 1F) of the layer of insulation material 14 experienced with the prior art process flow depicted in the background section of the application. By reducing or eliminating such under-cutting it is more like that conductive metal lines can be formed in the trench 240 without forming any or at least an unacceptable number of voids in the metal line.

In one illustrative embodiment, at the completion of the etching process that is performed to define the trench 240, the erodible spacers 204 may be completely consumed. However, to insure complete removal of any residual spacer material prior to performing subsequent processing operations, a cleaning process using, for example, a solvent or dilute HF acid, may be performed on the device 200 to insure complete removal of any residual material from the erodible spacers 204.

Figure 2G:
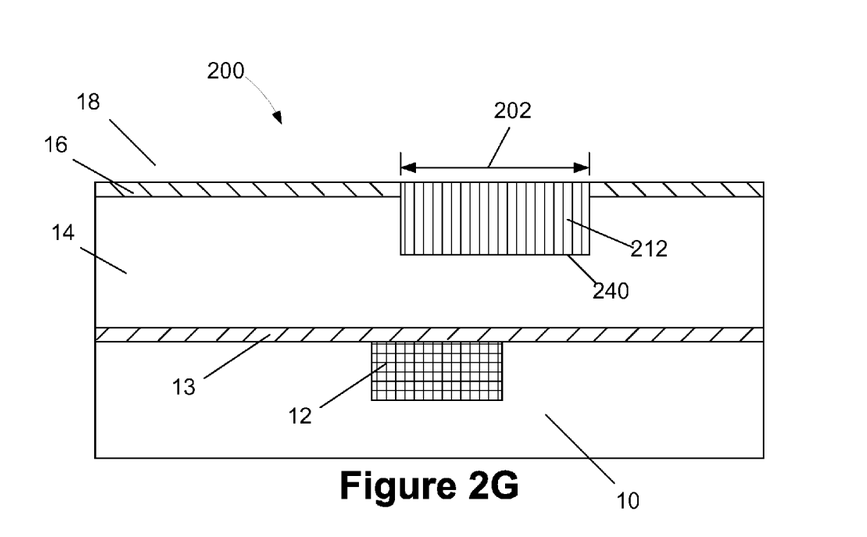
Figure 2H:
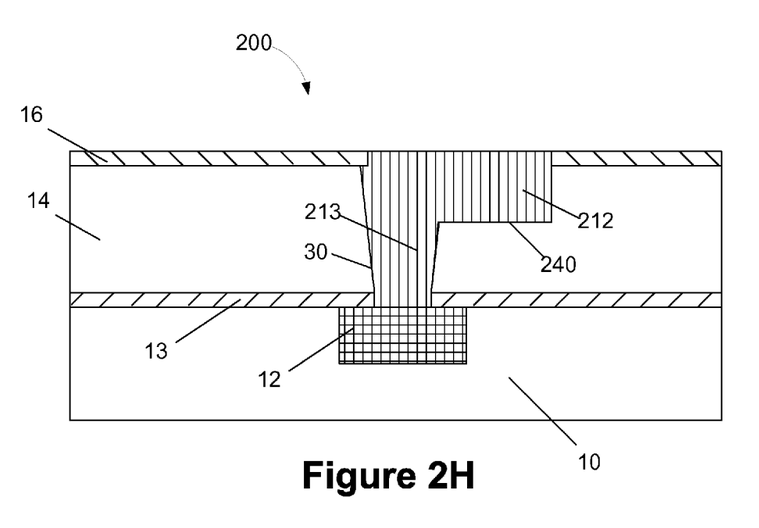

FIG. 2G is a cross-sectional view of the trench 240 of the device 200 at a later stage of manufacture wherein a conductive metal line 212 has been formed in the trench 240. FIG. 2H is a cross-sectional view of the device 200 showing the formation of a conductive via 213 and the conductive line 214 formed in the via opening 30 and the trench 240, respectively. The conductive via 213 and line 212 may be made from any of a variety of conductive materials. In one illustrative embodiment, the conductive via 213 and line 212 may be comprised of a metal and they may be formed by depositing one or more barrier layers (not shown) in the via opening 30 and in the trench 240 and thereafter depositing an appropriate conductive material, such as copper across the device 200. Thereafter, a chemical mechanical polishing (CMP) process may be performed using the stop layer 16 as a polish stop to remove the conductive materials positioned outside of the trench 240 and the via opening 30. This CMP process also removes the metal hard mask 18. The aforementioned process may be performed at any level of an integrated circuit device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising: forming a patterned hard mask layer above a layer of insulating material, said patterned hard mask having a hard mask opening; forming an erodible spacer in said hard mask opening to thereby define a spacer opening; and performing at least one etching process through said spacer opening on said layer of insulating material to define a trench therein for a conductive structure, wherein said erodible spacer is substantially eroded away during said at least one etching process, wherein said erodible spacer is comprised of a $C_xH_yF_z$ polymer material.

2. The method of claim 1, wherein said hard mask opening defines a critical dimension and wherein said erodible spacer in said hard mask opening defines a spacer opening that has a critical dimension that is less that said critical dimension of said hard mask opening.

3. The method of claim 1, wherein forming said erodible spacer in said hard mask opening comprises:
depositing a layer of erodible spacer material above said hard mask layer and in said hard mask opening; and
performing an anisotropic etching process on said layer of erodible spacer material.

4. The method of claim 1, wherein said erodible spacer has an initial base thickness of about 2-5 nm.

5. The method of claim 1, wherein said hard mask layer is comprised of a metal.

6. The method of claim 5, wherein said hard mask layer is comprised of titanium nitride.

7. The method of claim 1, wherein said layer of insulating material is a layer of low-k insulating material.

8. The method of claim 1 wherein said conductive structure is a metal line and wherein the method further comprises forming said conductive metal line in said trench.

9. The method of claim 1, wherein said step of forming said erodible spacer in said hard mask opening and said step of performing said at least one etching process through said spacer opening on said layer of insulating material to define a trench therein for a conductive structure are performed in situ in the same process chamber.

10. A method of forming a conductive structure in a layer of insulating material, the method comprising: forming a patterned hard mask layer above a layer of insulating material, said patterned hard mask having a hard mask opening with a critical dimension that corresponds to a final critical dimension for said conductive structure; forming an erodible spacer in said hard mask opening to thereby define a spacer opening that has a critical dimension that is less than said critical dimension of said hard mask opening; and performing at least one etching process through said spacer opening on said layer of insulating material to define a trench therein where said conductive structure is to be formed, wherein said erodible spacer is eroded away during said at least one etching process so as to increase said critical dimension of said spacer opening as said at least one etching process is performed, wherein said erodible spacer is comprised of a $C_xH_yF_z$ polymer material.

11. The method of claim 10, wherein said erodible spacer is substantially eroded away at the completion of the at least one etching process.

12. The method of claim 10, wherein said step of forming said erodible spacer in said hard mask opening and said step of performing said at least one etching process through said spacer opening on said layer of insulating material to define a trench therein where said conductive structure is to be formed are performed in situ in the same process chamber.

13. A method of forming a conductive structure in a layer of insulating material, the method comprising:
forming a patterned hard mask layer comprised of a metal above a layer of insulating material, said patterned hard mask having a hard mask opening with a critical dimension that corresponds to a final critical dimension for said conductive structure;
forming an erodible spacer comprised of a $C_xH_yF_z$ polymer material in said hard mask opening to thereby define a spacer opening that has a critical dimension that is less than said critical dimension of said hard mask opening; and performing at least one etching process through said spacer opening on said layer of insulating material to define a trench therein where said conductive structure is to be formed, wherein said erodible spacer is eroded away during said at least one etching process so as to increase said critical dimension of said spacer opening as said at least one etching process is performed.

14. The method of claim 13, wherein said erodible spacer is substantially eroded away at the completion of the at least one etching process.

15. The method of claim 13, wherein said step of forming said erodible spacer in said hard mask opening and said step of performing said at least one etching process through said spacer opening on said layer of insulating material to define a trench therein where said conductive structure is to be formed are performed in situ in the same process chamber.

* * * * *